(12) United States Patent
Sel et al.

(10) Patent No.: US 7,821,834 B2
(45) Date of Patent: Oct. 26, 2010

(54) NONVOLATILE MEMORY DEVICES THAT UTILIZE DUMMY MEMORY CELLS TO IMPROVE DATA RELIABILITY IN CHARGE TRAP MEMORY ARRAYS

(75) Inventors: Jongsun Sel, Gyeonggi-do (KR); Yoocheol Shin, Gyeonggi-do (KR); Jaesung Sim, Gyeonggi-do (KR)

(73) Assignee: Samsung Electroncis Co., Ltd. (KR)

( * ) Notice: Subject to any disclaimer, the term of this patent is extended or adjusted under 35 U.S.C. 154(b) by 248 days.

(21) Appl. No.: 12/164,533

(22) Filed: Jun. 30, 2008

(65) Prior Publication Data

US 2009/0168532 A1 Jul. 2, 2009

(30) Foreign Application Priority Data

Dec. 27, 2007 (KR) ............... 10-2007-0132311

(51) Int. Cl.
G11C 16/04 (2006.01)
(52) U.S. Cl. .................... 365/185.17; 365/185.18; 365/185.2; 365/185.29
(58) Field of Classification Search ............ 365/185.17, 365/185.18, 185.2, 185.29; 257/315, E29.309
See application file for complete search history.

(56) References Cited

U.S. PATENT DOCUMENTS

| | | | |
|---|---|---|---|
| 5,274,599 A | 12/1993 | Ema | |
| 6,078,522 A | 6/2000 | Park et al. | |
| 6,541,858 B1 | 4/2003 | Farrar | |
| 6,611,460 B2 | 8/2003 | Lee et al. | |
| 6,614,688 B2 | 9/2003 | Jeong et al. | |
| 6,858,906 B2 | 2/2005 | Lee et al. | |
| 6,881,626 B2 | 4/2005 | Lee et al. | |
| 6,922,359 B2 | 7/2005 | Ooishi | |
| 6,947,330 B2 | 9/2005 | Lee | |
| 7,016,226 B2* | 3/2006 | Shibata et al. | ......... 365/185.03 |

(Continued)

FOREIGN PATENT DOCUMENTS

KR 1020040068923 A 8/2004

(Continued)

OTHER PUBLICATIONS

"Flash Memory," http://en.wikipedia.org/wiki/Flash_memory, Printed from the Internet on Nov. 16, 2007; 12 pages, Admitted Prior Art.

(Continued)

Primary Examiner—VanThu Nguyen
(74) Attorney, Agent, or Firm—Myers Bigel Sibley & Sajovec

(57) ABSTRACT

A charge trap flash memory device includes a flash memory array having at least a first page of charge trap memory cells therein electrically coupled to a first word line. The first page of charge trap memory cells includes a plurality of addressable memory cells configured to store data to be retrieved during read operations and a plurality of immediately adjacent non-addressable "dummy" memory cells configured to store dummy data that is not retrievable during the read operations. The plurality of dummy memory cells include at least one auxiliary dummy memory cell that operates as a buffer against lateral hole transfer within a charge trap layer of the array.

19 Claims, 15 Drawing Sheets

U.S. PATENT DOCUMENTS

| | | |
|---|---|---|
| 7,126,185 B2 | 10/2006 | Kang et al. |
| 7,170,795 B2 | 1/2007 | Lee |
| 7,179,709 B2 | 2/2007 | Kim et al. |
| 2006/0171209 A1 | 8/2006 | Sim et al. |
| 2006/0267079 A1 | 11/2006 | Huang et al. |
| 2007/0064498 A1 | 3/2007 | Lee et al. |
| 2007/0070699 A1 | 3/2007 | Lee |

FOREIGN PATENT DOCUMENTS

| | | |
|---|---|---|
| KR | 1020060097880 A | 9/2006 |
| KR | 1020070022812 A | 2/2007 |

OTHER PUBLICATIONS

"Samsung unwraps 40nm 'charge trap flash' device," Solid State Technology, http://solidstate.articles.printthis.clickability.com/pt/cpt?action=cpt&title+solid+-State+Te..., Printed from the Internet on Nov. 16, 2007, 2 pages, Admitted Prior Art.

"Charge trap flash," http://en.wikipedia.org/wiki/Charge_trap_flash, Printed from the Internet on Nov. 16, 2007, 1 page, Admitted Prior Art.

* cited by examiner

NONVOLATILE MEMORY DEVICES THAT UTILIZE DUMMY MEMORY CELLS TO IMPROVE DATA RELIABILITY IN CHARGE TRAP MEMORY ARRAYS

REFERENCE TO PRIORITY APPLICATION

This application claims priority to Korean Application No. 2007-0132311, filed Dec. 17, 2007, the disclosure of which is hereby incorporated herein by reference.

FIELD OF THE INVENTION

The present invention relates to integrated circuit memory devices and, more particularly, to nonvolatile memory devices and methods of programming nonvolatile memory devices.

BACKGROUND OF THE INVENTION

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

One category of EEPROM devices includes NAND-type flash memories, which can provide a low cost and high capacity alternative to other forms of nonvolatile memory. FIG. 1A illustrates a conventional flash memory array 1 having a plurality of NAND-type strings therein. Each of these NAND-type strings includes a plurality of EEPROM cells, which are associated with respective even and odd bit lines (BL0_e, BL0_o ..., BLn_e, BLn_o). These bit lines are connected to a page buffer 2 having a plurality of buffer circuits (PB0, ..., PBn) therein. Each EEPROM cell includes a charge trap layer (or floating gate electrode) and a control gate electrode, which is electrically connected to a respective word line (WL0, WL1, ..., WLn). Access to each NAND string is enabled by driving a string select line (SSL) associated with string selection transistors to a logic 1 voltage during reading and programming operations. Each NAND string also includes a respective ground selection transistor, which is electrically connected to a ground select line (GSL).

As illustrated by FIG. 1B, the EEPROM cells within the flash memory array 1 of FIG. 1A may be cells that support a single programmed state. EEPROM cells that support only a single programmed state are typically referred to as single level cells (SLC). In particular, an SLC may support an erased state, which may be treated as a logic 1 storage value, and a programmed state, which may be treated as a logic 0 storage value. The SLC may have a negative threshold voltage (Vth) when erased (e.g., −3V<Vth<−1V) and a positive threshold voltage when programmed (e.g., 1V<Vth<3V). This programmed state may be achieved by setting the bit line BL to a logic 0 value (e.g., 0 Volts), applying a program voltage (Vpgm) to a selected EEPROM cell and applying a pass voltage (Vpass) to the unselected EEPROM cells within a string, as illustrated by FIG. 1C. In addition, during programming the NAND string may be enabled by applying a positive voltage (e.g., power supply voltage Vdd) to the string select line (SSL) and a ground voltage (e.g., 0 Volts) to the ground select line (GSL).

Moreover, the programmed state or erased state of an EEPROM cell may be detected by performing a read operation on a selected cell. As illustrated by FIG. 1D, a NAND string will operate to discharge a precharged bit line BL when a selected cell is in an erased state and the selected word line voltage (e.g., 0 Volts) is greater than the threshold voltage of the selected cell. However, when a selected cell is in a programmed state, the corresponding NAND string will provide an open circuit to the precharged bit line BL because the selected word line voltage (e.g., 0 Volts) is less than the threshold voltage of the selected cell and the selected cell remains "off". Other aspects of NAND-type flash memories are disclosed in an article by Jung et al., entitled "A 3.3 Volt Single Power Supply 16-Mb Nonvolatile Virtual DRAM Using a NAND Flash Memory Technology," IEEE Journal of Solid-State Circuits, Vol. 32, No. 11, pp. 1748-1757, November (1997), the disclosure of which is hereby incorporated herein by reference. Charge trap flash (CTF) memory cells are also disclosed in U.S. Pat. No. 7,126,185 to Kang et al. and U.S. Pat. Publication No. 2006/0171209 to Sim et al.

Additional aspects of NAND-type flash memories are disclosed in U.S. Pat. Publication No. 2007/0070699 to Lee entitled "Nonvolatile Semiconductor Memory Device Having Dummy Bit Line With Multiple Sections," and U.S. Pat. Nos. 6,611,460 and 6,614,688. In particular, U.S. Pat. Publication No. 2007/0070699 to Lee discloses a flash EEPROM device that sacrifices a NAND-type string of floating gate EEPROM cells in order to provide a direct connection to a common source line (CSL). This flash EEPROM device also utilizes a plurality of dummy bit segments as pocket P-well biasing straps. Moreover, the string selection transistors and ground selection transistors within each NAND-type string may be configured as disclosed at FIGS. 2, 5-6 and 10 of U.S. Pat. No. 6,881,626 Lee et al., entitled "Method of Fabricating A Non-Volatile Memory Device With a String Select Gate," and as disclosed in U.S. Pat. No. 6,858,906 to Lee et al., the disclosures of which is hereby incorporated herein by reference.

SUMMARY OF THE INVENTION

Integrated circuit memory devices according to embodiments of the invention utilize multiple "dummy" strings of memory cells within non-volatile memory arrays. In some of these embodiments, the memory cells include charge trap memory cells and the multiple "dummy" strings include both primary and auxiliary dummy strings. In particular, one or more auxiliary dummy strings is provided to increase a degree of electrical isolation between the charge trap layers of memory cells within the primary dummy string and the charge trap layers of "normal" memory cells that are configured to store data that is accessible during read and write operations. This increased electrical isolation precludes potentially over-erased memory cells within the primary dummy string from adversely influencing the "normal" memory cells by altering their threshold voltages in response to lateral charge transfer (e.g., hole transfer) across the charge trap layers of the memory array.

Some embodiments of the present invention include a semiconductor substrate having a well region of first conductivity type (e.g., P-type) therein and a non-volatile memory array on the well region. The non-volatile memory array has first and second pluralities of NAND strings of "normal" charge trap memory cells therein that are separated from each other by a primary dummy NAND string of charge trap memory cells and at least one auxiliary dummy NAND string of charge trap memory cells extending immediately adjacent the primary dummy NAND string. The primary dummy NAND string includes a primary dummy bit line electrically connected to the well region. According to these embodiments, the primary dummy NAND string may include a string selection transistor having a first source/drain region of first conductivity type (e.g., P-type) that forms a non-rectifying junction with an underlying well region. This first source/drain region of first conductivity type is electrically connected to the primary dummy bit line so that the primary dummy bit line may provide an appropriate bias to the well region and thereby prevent the well region from floating electrically relative to surrounding regions. The string selection transistor may also include a second source/drain region of second conductivity type (e.g., N-type) that forms a rectifying junction with the well region. In this case, the string selection transistor is configured to preclude programming of the memory cells within the primary dummy string because any inversion-layer channel formed underneath a gate electrode of the string selection transistor forms a rectifying junction with the first source/drain region of opposite conductivity type. The auxiliary dummy NAND string may also include an auxiliary dummy bit line that is electrically connected to the primary dummy bit line.

According to still further embodiments of the invention, a charge trap flash memory device is provided having at least one flash memory array therein. The flash memory array includes at least a first page of charge trap memory cells that are electrically coupled to a first word line. The first page of charge trap memory cells includes a plurality of addressable memory cells configured to store data to be retrieved during read operations and a plurality of immediately adjacent non-addressable memory cells configured to store dummy data that is not retrievable during the read operations. In particular, the plurality of immediately adjacent non-addressable memory cells include a primary dummy memory cell, which is precluded from being programmed during operations to write a page of data into the first page of charge trap memory cells, and at least one auxiliary dummy memory cell, which is programmed with dummy data during each operation to write a page of data into the first page of charge trap memory cells. This auxiliary dummy memory cell buffers the primary dummy memory cell from the addressable memory cells and thereby reduces the likelihood that an over-erased primary dummy memory cell will influence the threshold voltage(s) of a nearby addressable memory cell(s).

DETAILED DESCRIPTION OF PREFERRED EMBODIMENTS

Figure 1A:
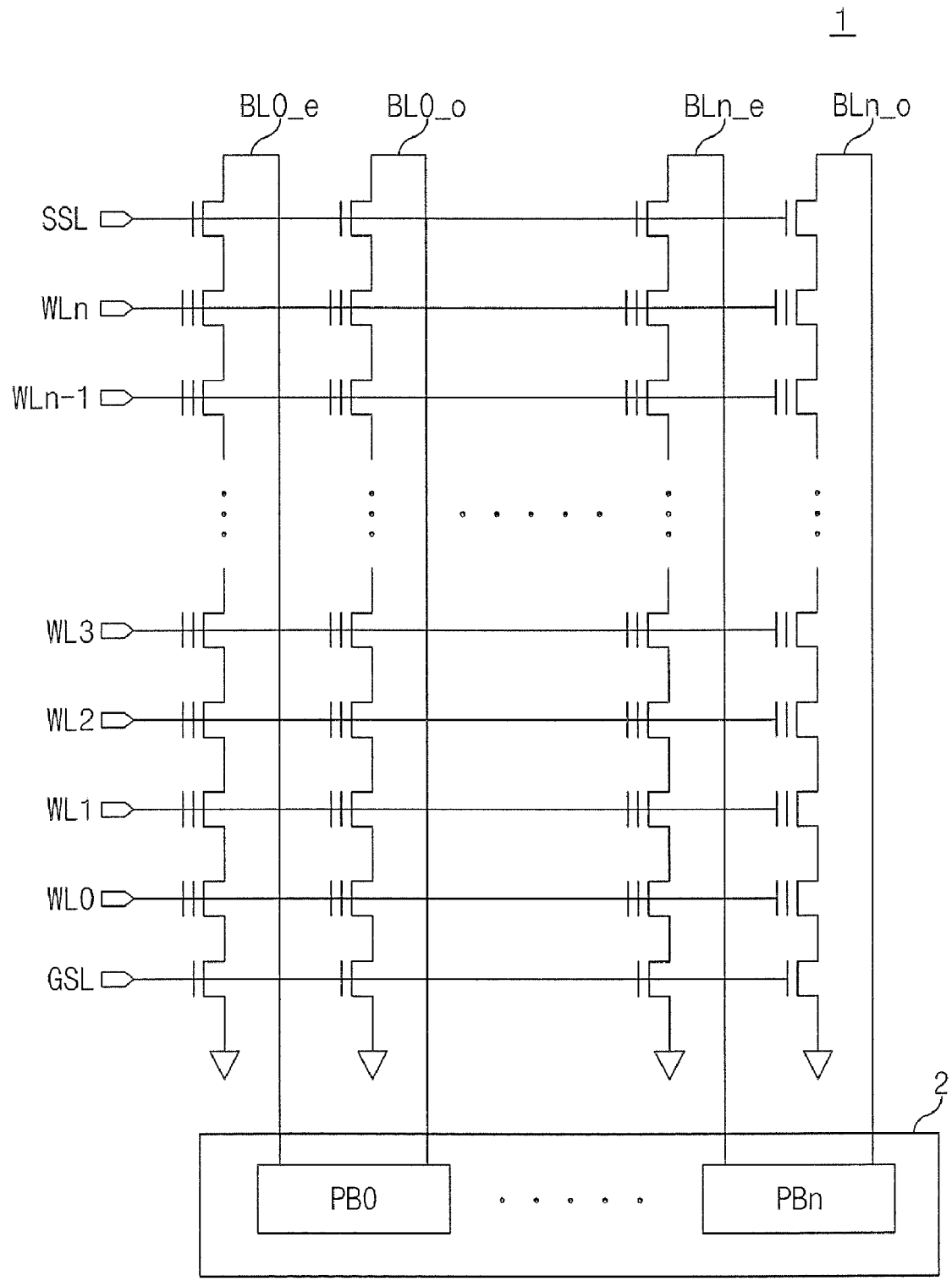
FIG. 1A is an electrical schematic of a conventional non-volatile memory device having NAND-type strings of EEPROM cells therein.
Figure 1B:
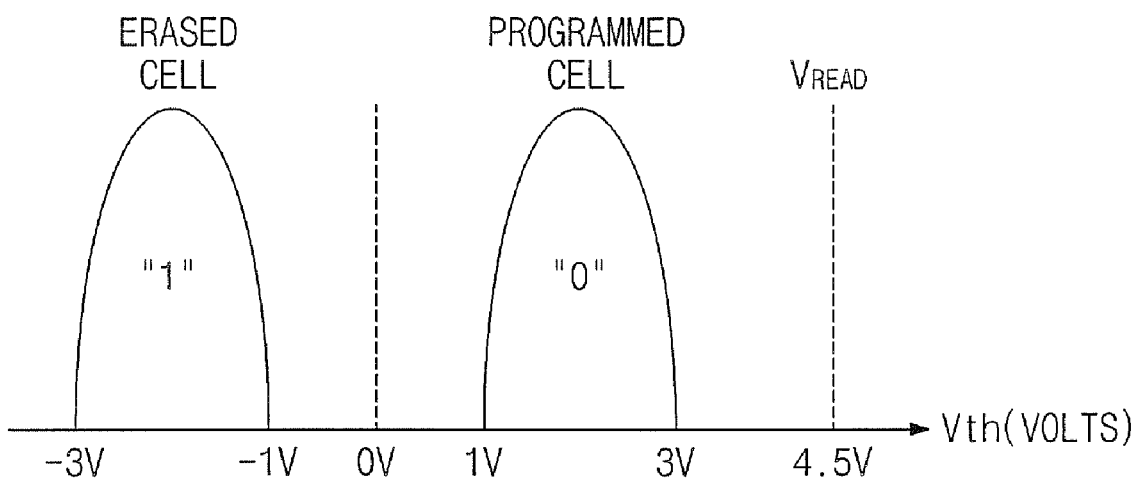
FIG. 1B is a graph illustrating the relative threshold voltages of an erased and programmed EEPROM cell, according to the prior art.
Figure 1C:
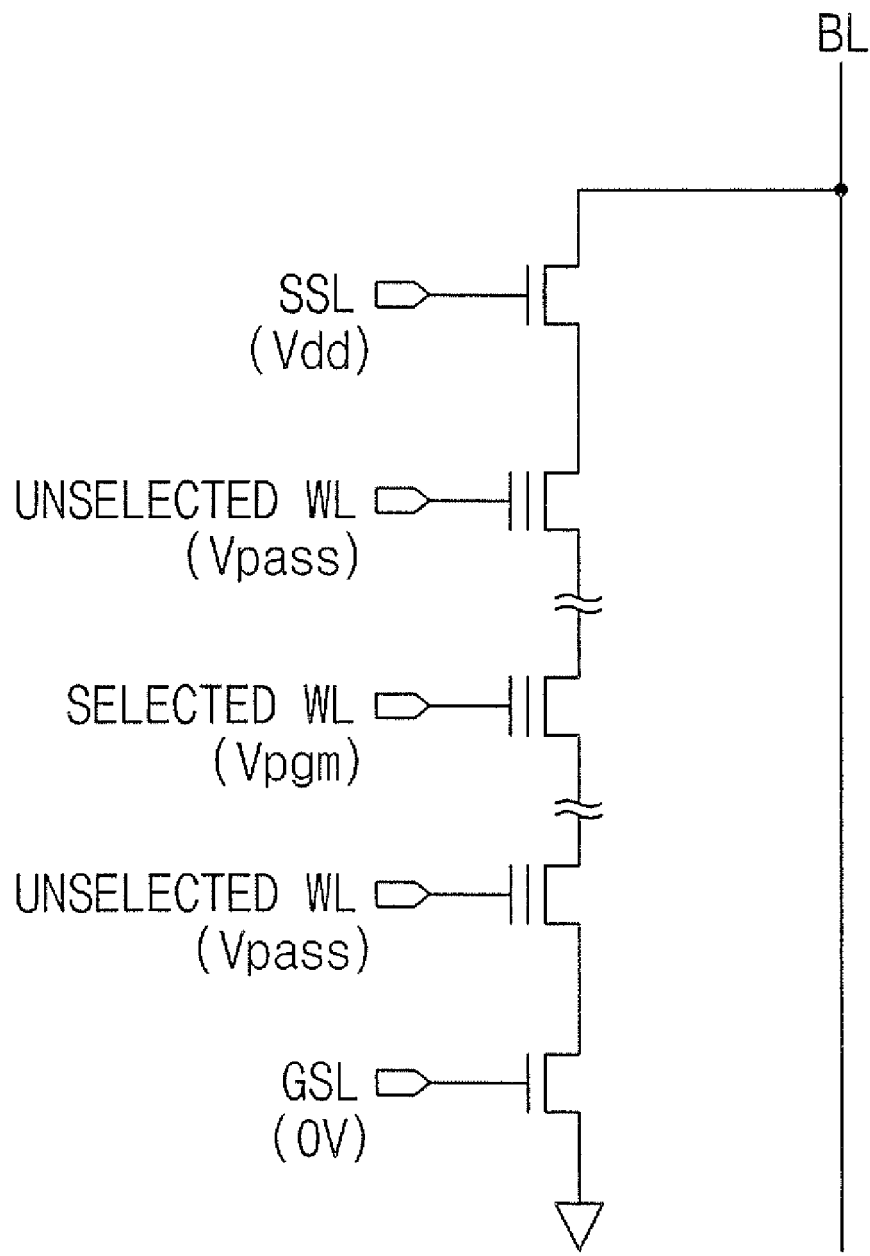
FIG. 1C is an electrical schematic of a NAND-type string of EEPROM cells showing programming bias conditions.
Figure 1D:
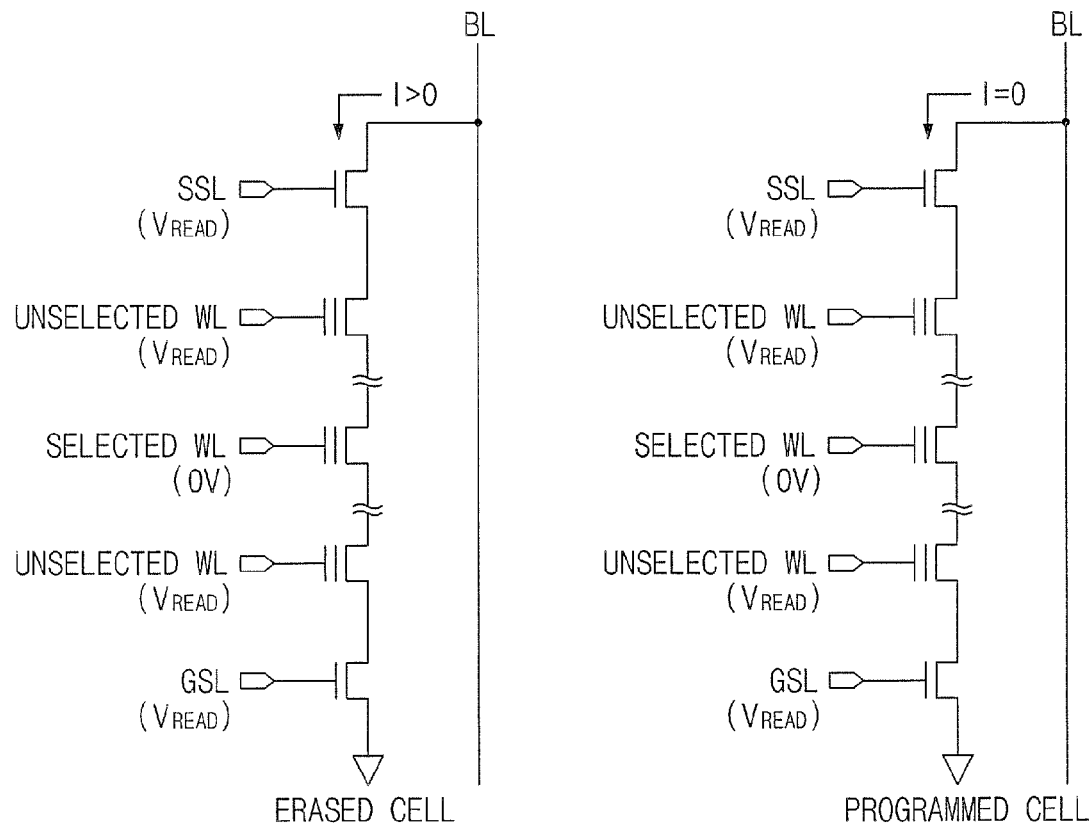
FIG. 1D illustrates current flow in a NAND-type string during operations to read data from an erased EEPROM cell and a programmed EEPROM cell according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 2A:
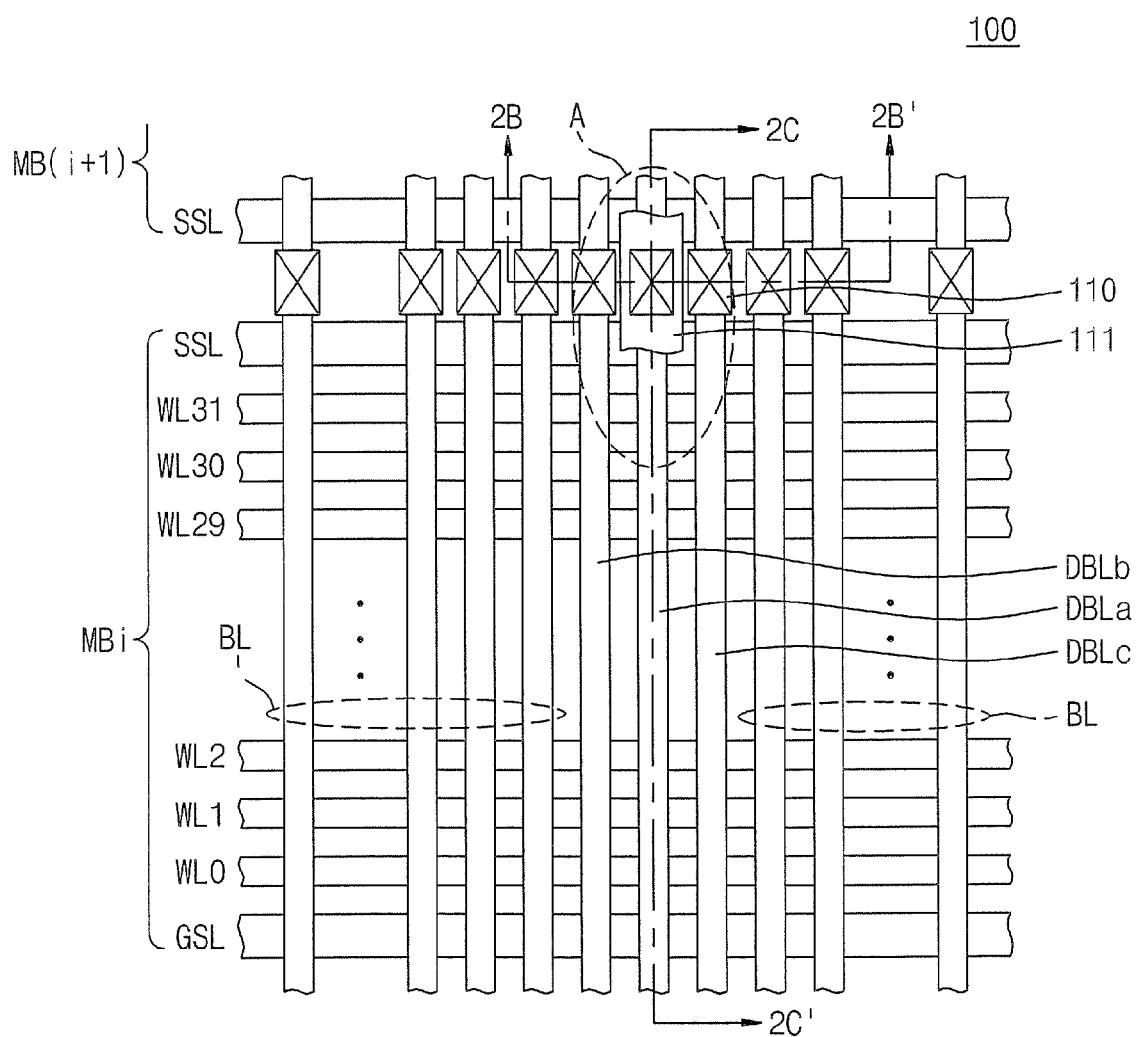
FIG. 2A is a layout view of an integrated circuit memory device according to an embodiment of the present invention.
Figure 2B:
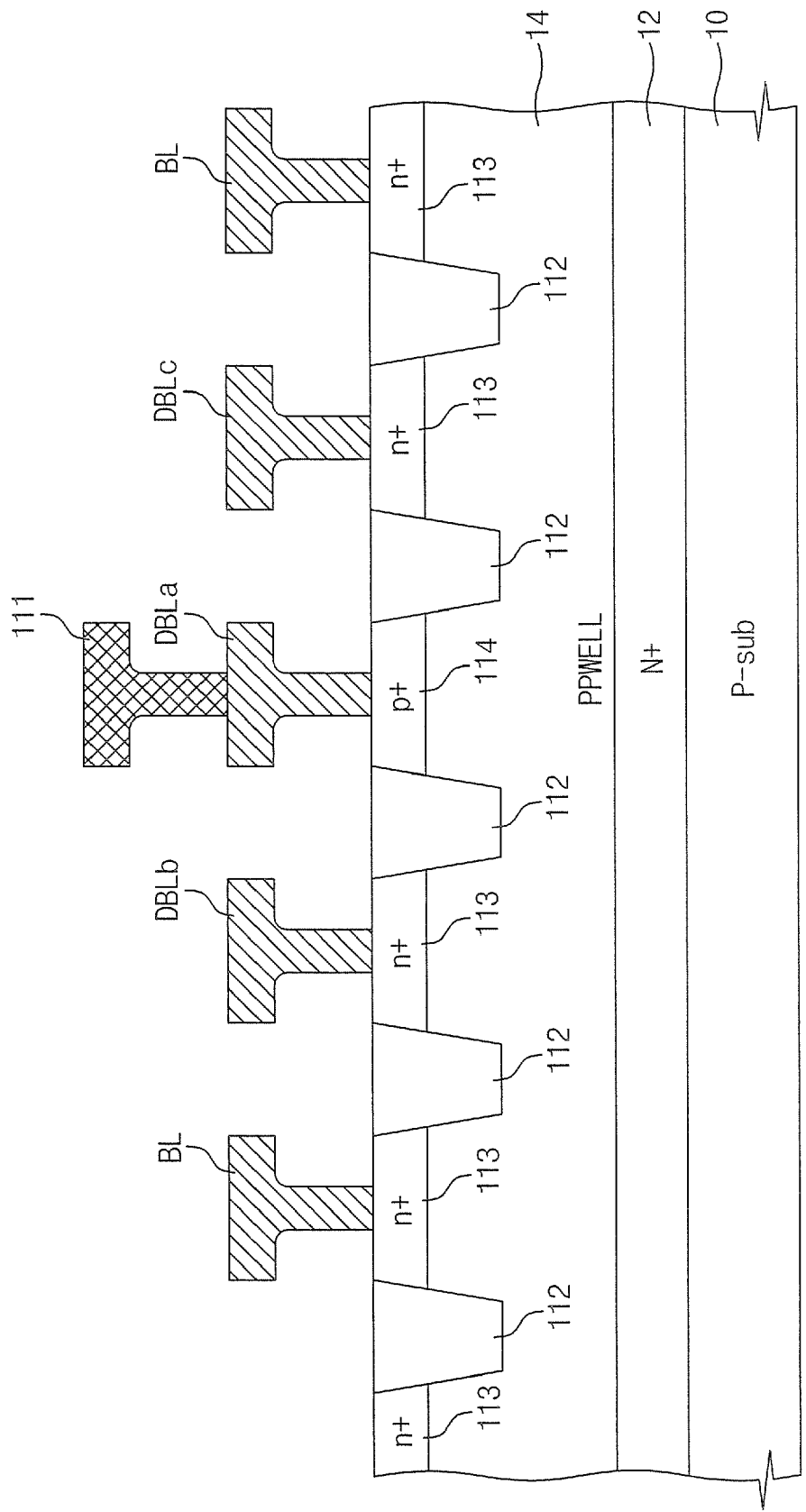
FIG. 2B is a cross-sectional view of the memory device of FIG. 2A, taken along line 2B-2B'.
Figure 2C:
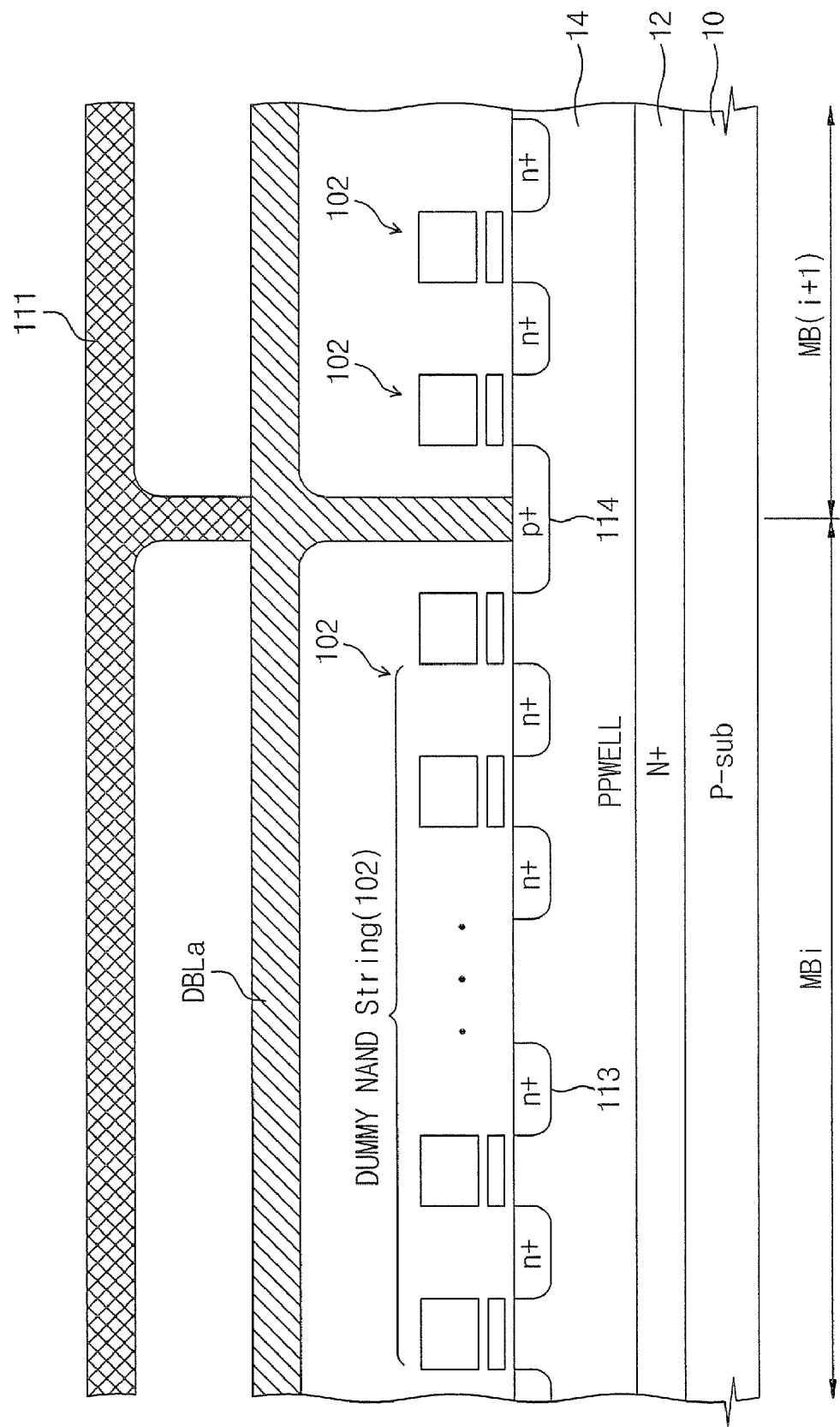
FIG. 2C is a cross-sectional view of the memory device of FIG. 2A, taken along line 2C-2C'.
Figure 2D:
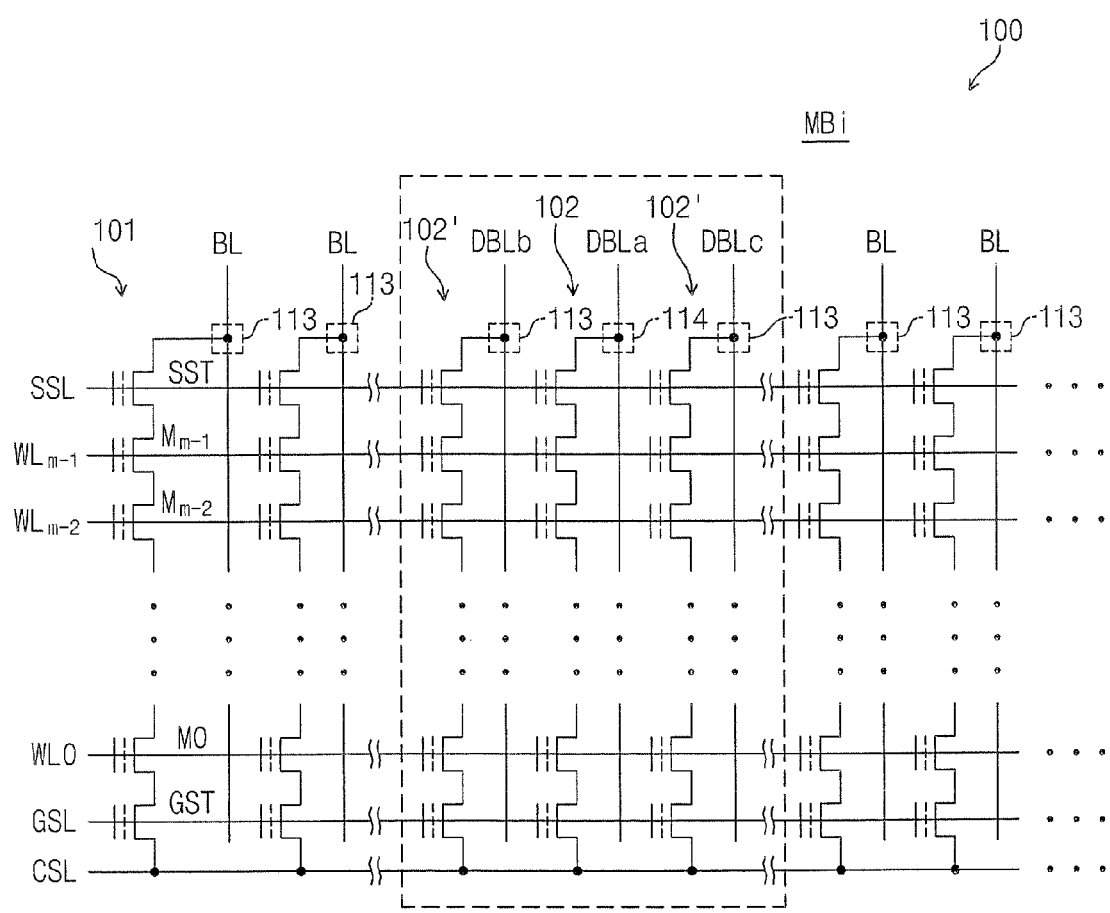
FIG. 2D is an electrical schematic of the memory device of FIG. 2A.

FIGS. 2A and 2D are layout and schematic views of a non-volatile integrated circuit memory device 100 according to a first embodiment of the present invention. This memory device 100 is a non-volatile memory device, which may include multiple arrays (a/k/a blocks) of non-volatile memory cells. As described herein, the non-volatile memory cells within the memory device 100 are charge trap EEPROM cells that may utilize multi-layer charge trap insulating layers, however, other types of non-volatile memory cells (e.g., floating gate type) may also be used. The illustrated array of non-volatile memory cells within the memory device 100 includes a plurality of NAND-type strings of charge trap EEPROM cells that are respectively connected to corresponding bit lines. The bit lines are illustrated as "normal" bit lines BL, which are associated with "normal" NAND-type strings 101 of charge trap EEPROM cells that store data written to and read from the memory device 100, and "dummy" bit lines. The dummy bit lines are associated with "dummy" NAND-type strings 102 and 102' of charge trap EEPROM cells that are not addressable during read operations and therefore do not contribute to the data capacity of the memory device 100. The dummy bit lines are illustrated as DBLa, which represents a primary dummy bit line associated with a primary dummy NAND-type string 102 of charge trap memory cells, and DBLb and DBLc, which represent auxiliary dummy bit lines associated with a pair of auxiliary dummy NAND-type strings 102' of charge trap memory cells. The three dummy NAND-type strings 102 and 102' of charge trap memory cells separate a first plurality of addressable NAND-type strings 101 on the left side of the illustrated array from a second plurality of addressable NAND-type strings 101 on the right side of the illustrated array.

The illustrated array of charge trap memory cells is associated with a first memory block MBi of cells, within a multi-block memory device (e.g., containing blocks MB(i−1), MB(i+1), . . . ). This first memory block MBi of cells includes a plurality of word lines, shown as WL0-WL31, a string select line (SSL) and a ground select line (GSL). The string select line SSL is electrically connected to the gate electrodes of respective string select transistors (e.g., NMOS transistors) at the top of each string of memory cells and the ground select line (GSL) is electrically connected to the gate electrodes of respective ground select transistors (e.g., NMOS transistors) at the bottom of each string of memory cells. Each of the string select transistors includes a source/drain region that is electrically connected by an electrically conductive via 110 to a respective bit line BL. As illustrated by the highlighted region A in FIG. 2A and the cross-section of FIG. 2B, the source/drain region 114 of a string selection transistor within the primary dummy string 102 of charge trap EEPROM cells is electrically connected by a conductive via 110 to a dummy bit line at one level of metallization (e.g., M1) and to a metal strap 111 at a higher level of metallization (e.g., M2).

FIG. 2B illustrates a cross-sectional view of the memory device of FIG. 2A, taken along lines 2B-2B'. In particular, FIG. 2B illustrates a cross-section of the source/drain regions of the string selection transistors within the array associated with the first memory block MBi. With respect to the normal NAND-type strings of charge trap memory cells and the auxiliary dummy NAND-type strings of charge trap memory cells (associated with dummy bit lines DBLb and DBLc), the source/drain regions are N-type (e.g., N+) semiconductor regions 113 of respective NMOS transistors. These source/drain regions 113 are separated from each other by respective trench isolation regions 112. These trench isolation regions 112 are spaced-apart from each other within a pocket P-well region 14 (PPWELL). This pocket P-well region 14 forms a rectifying junction with an underlying N+ well region (e.g., N-type epitaxial layer 12), which extends in a P-type semiconductor substrate 10. In contrast, a source/drain region of the string selection transistor within the dummy NAND-type string is a P-type (e.g., P+) semiconductor region 114, which forms a non-rectifying junction with the pocket P-well region 14.

FIG. 2C illustrates a cross-sectional view of the primary dummy string 102 of charge trap EEPROM cells associated with the primary dummy bit line DBLa and the upper level metal strap 111. The string selection transistors associated with the adjacent memory blocks MBi and MB(i+1) share a P+ source/drain region 114, which provides a direct electrical contact to the primary dummy bit line DBLa and metal strap 111. This direct electrical contact enables a memory control circuit (not shown) to directly control the voltage potential of the pocket P-well region 14, via the metal strap 111 and the primary dummy bit line DBLa. This direct control prevents the pocket P-well region 14 from experiencing localized floating effects (i.e., well voltage "drift") that may alter the threshold voltages of the surrounding charge trap EEPROM cells. The presence of the P+ source/drain region 114 with each primary dummy string 102 of charge trap EEPROM cells also precludes programming of the cells within the primary dummy string 102 when respective rows of cells within the other normal strings 101 and auxiliary dummy strings 102' within the block MBi undergo programming. The P+ source/drain region 114 blocks programming of cells in the primary dummy string 102 by preventing normal operation of the corresponding string selection transistor.

According to some embodiments of the invention, the auxiliary dummy bit lines DBLb and DBLc may be held at fixed voltage levels (e.g., 0 Volts) to enable programming of the charge trap EEPROM cells within the auxiliary dummy strings 102' with "dummy" data, which is not available for reading when a page read operation is performed on the corresponding block MBi. Although not wishing to be bound by any theory, it is believed that the inability of the charge trap memory cells within the primary dummy string 102 to undergo programming during repeated operations to write a page of data into each row of the memory block MBi eventually results in an over-erase condition within these cells. This over-erase condition may result in an accumulation of migratable positive charge carriers (i.e., holes) within the charge trap regions of the cells and the transfer of these charge carriers to cells in adjacent strings. Accordingly, the use of a pair of auxiliary dummy strings 102' on opposing sides of the primary dummy string 102 operates as a physical buffer to remove and/or limit the influence of these excessive charge carriers on the threshold voltages of cells within the normal strings 101.

Figure 3A:
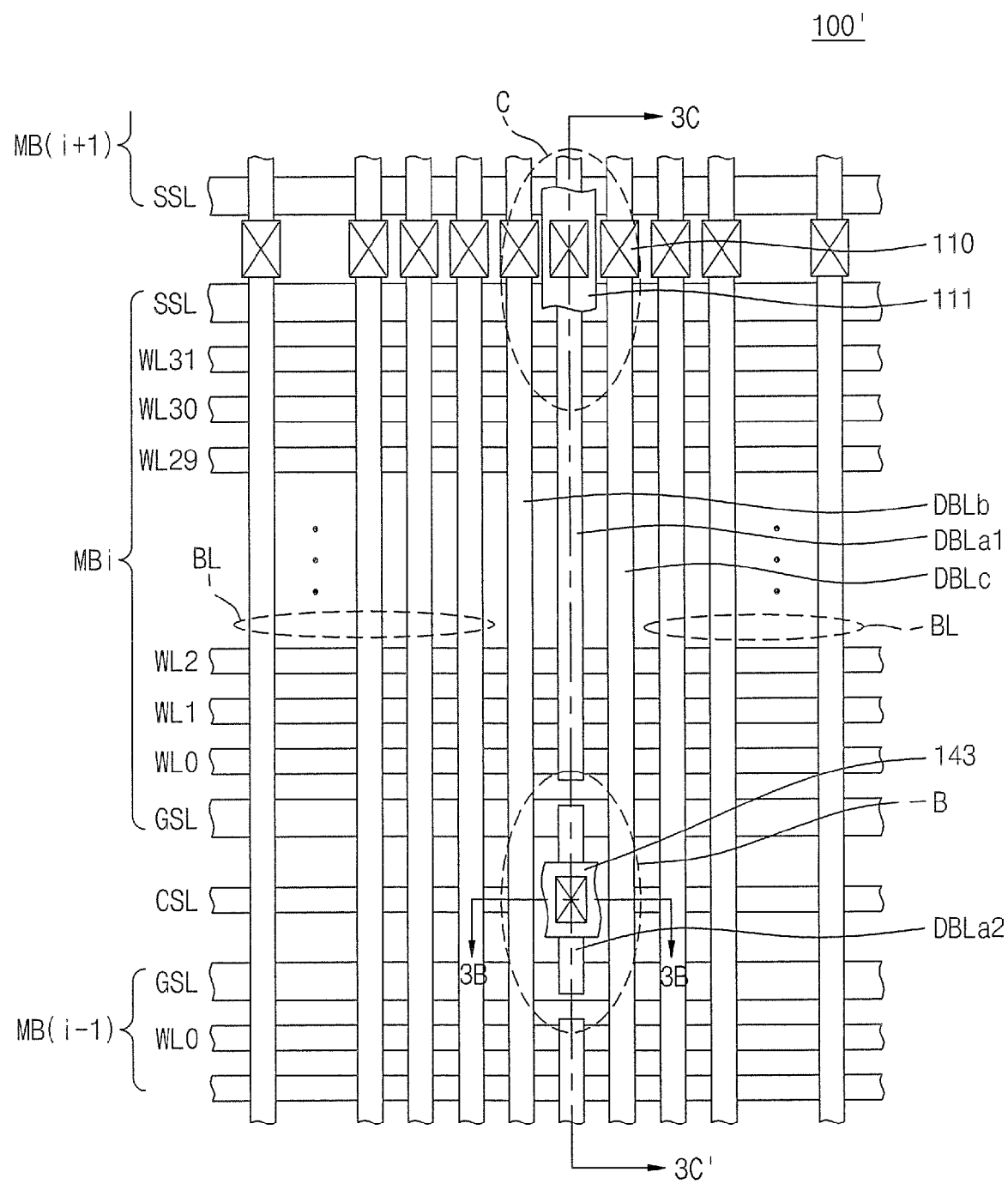
FIG. 3A is a layout view of an integrated circuit memory device according to another embodiment of the present invention.
Figure 3B:
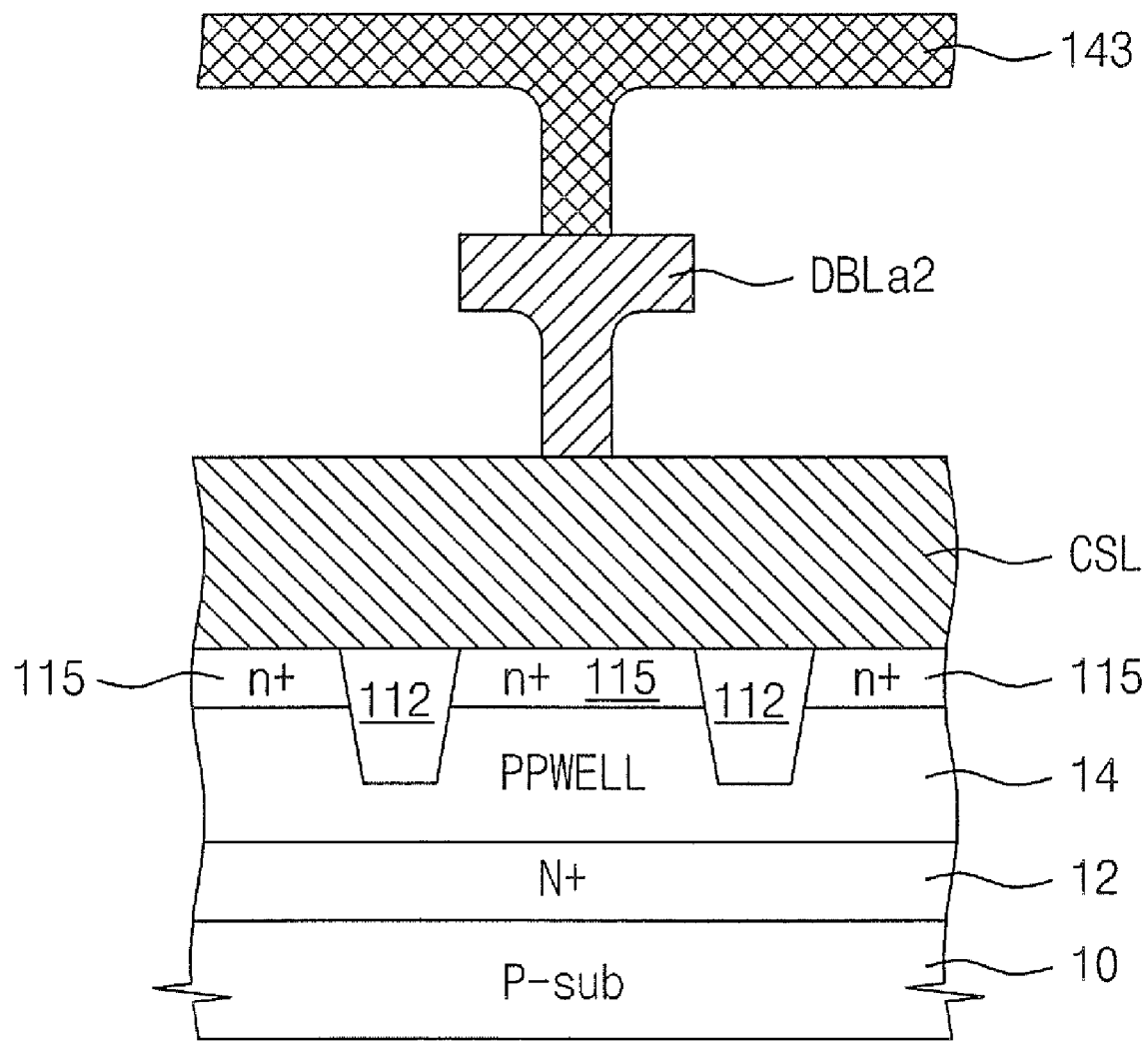
FIG. 3B is a cross-sectional view of the memory device of FIG. 3A, taken along line 3B-3B'.
Figure 3C:
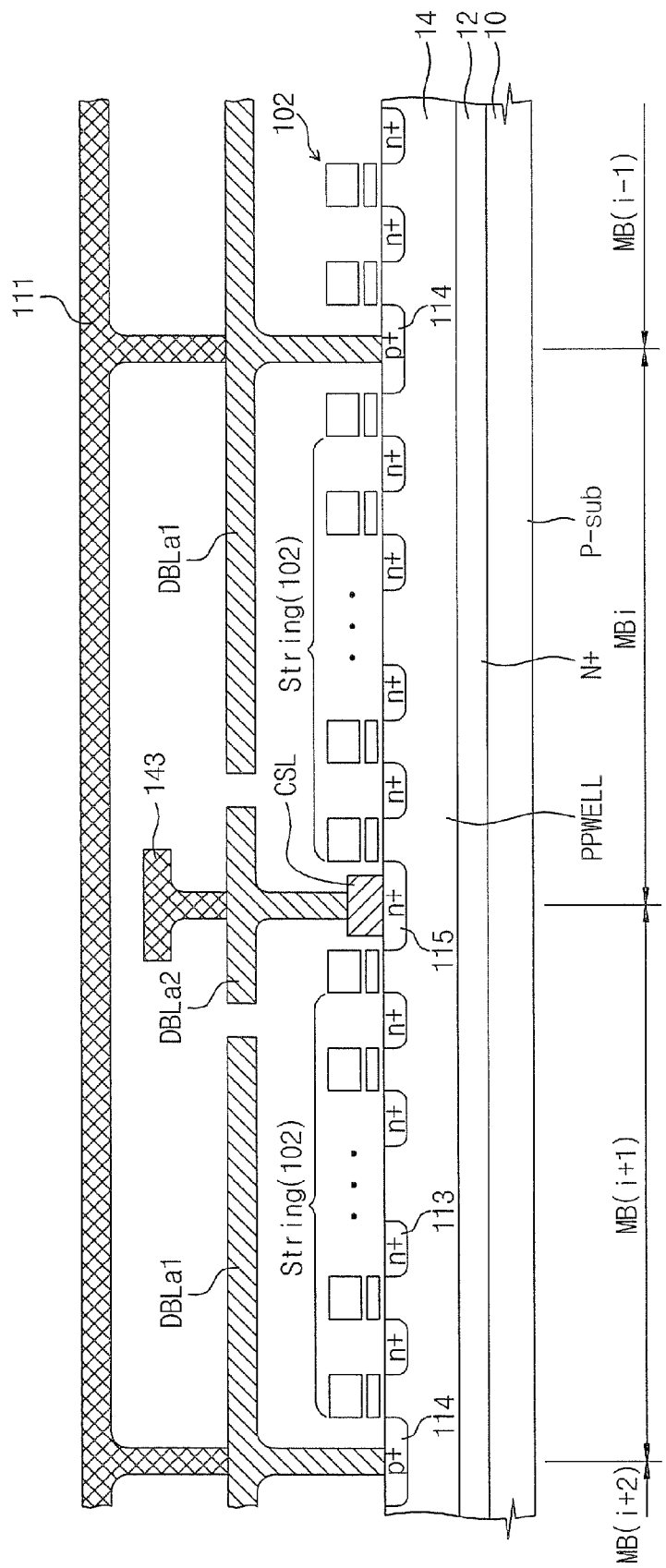
FIG. 3C is a cross-sectional view of the memory device of FIG. 3A, taken along line 3C-3C'.

FIG. 3A is a layout view of an integrated circuit memory device 100' according to another embodiment of the present invention. This memory device 100' of FIG. 3A is similar to the memory device 100 of FIG. 2A, however, the primary dummy string 102 of FIG. 3A includes a segmented primary dummy bit line. This segmented bit line includes the segments DBLa1 and DBLa2. Segment DBLa1, which is biased at a fixed potential by a control circuit (not shown), is electrically connected to a P+ semiconductor region 114 within the pocket P-well region 14. As highlighted by region C in FIG. 3A, each segment DBLa1 is also connected to a corresponding metal strap 111 at an upper level of metallization (e.g., M2). Moreover, as illustrated by FIGS. 3B-3C and highlighted by region B in FIG. 3A, segment DBLa2 is electrically connected by a multi-level interconnect to a common source line CSL and to a metal strap 143 that is biased at a fixed potential (e.g., Vss). This common source line CSL may be a patterned metal line that extends on an alternating sequence of N+semiconductor regions 115 and trench isolation regions 112. Based on these electrical connections, the bit line segment DBLa1 will be driven with an erase voltage (e.g., +20 Volts), which is transferred to the pocket P-well region 14, and the auxiliary dummy bit lines DBLb and DBLc and the normal bit lines associated with the normal strings of CTF memory cells may be electrically floated, during an operation to erase the memory device 100'.

Figure 4A:
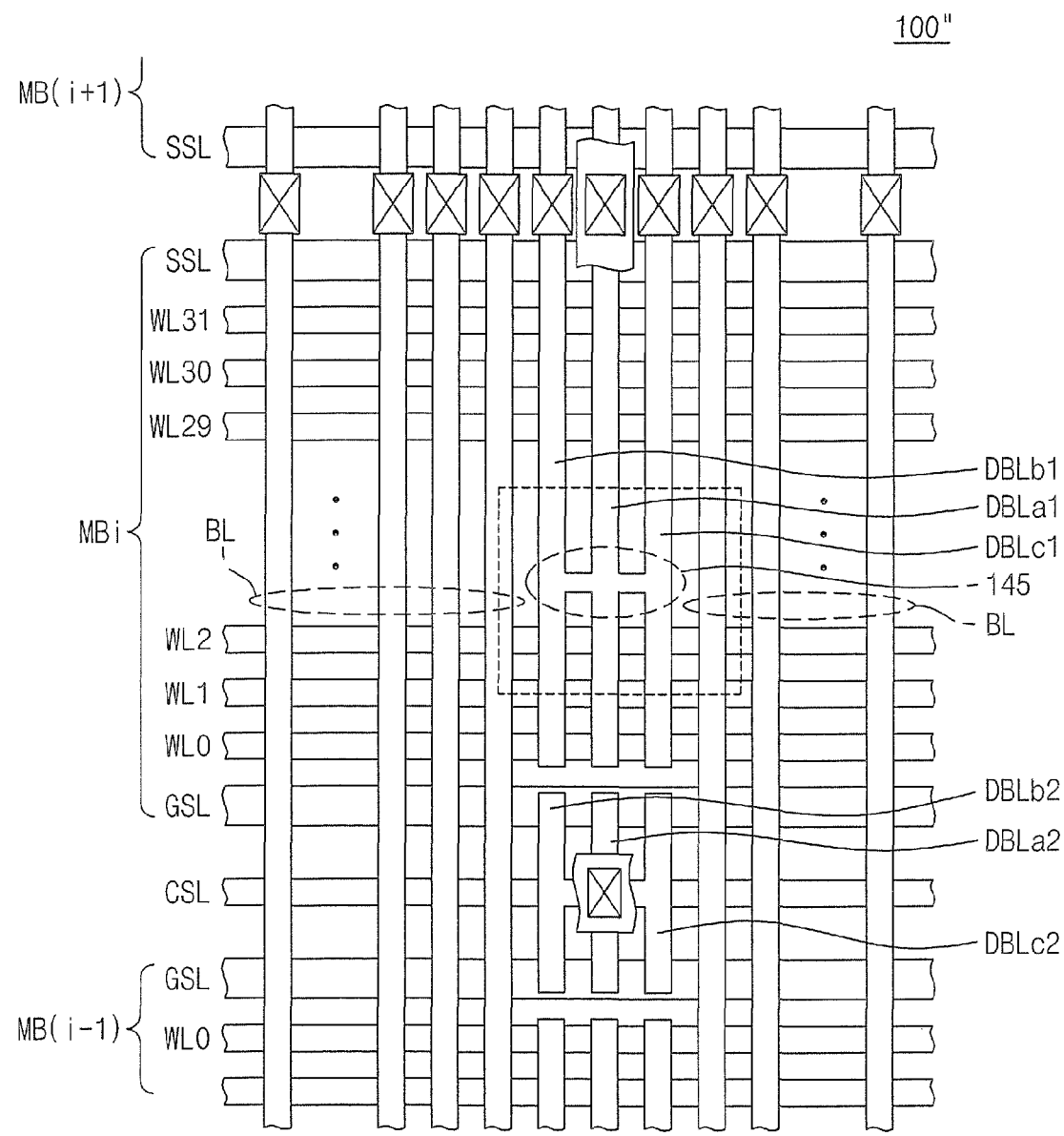
FIGS. 4A-4B are layout views of integrated circuit memory devices according to additional embodiments of the present invention.
Figure 4B:
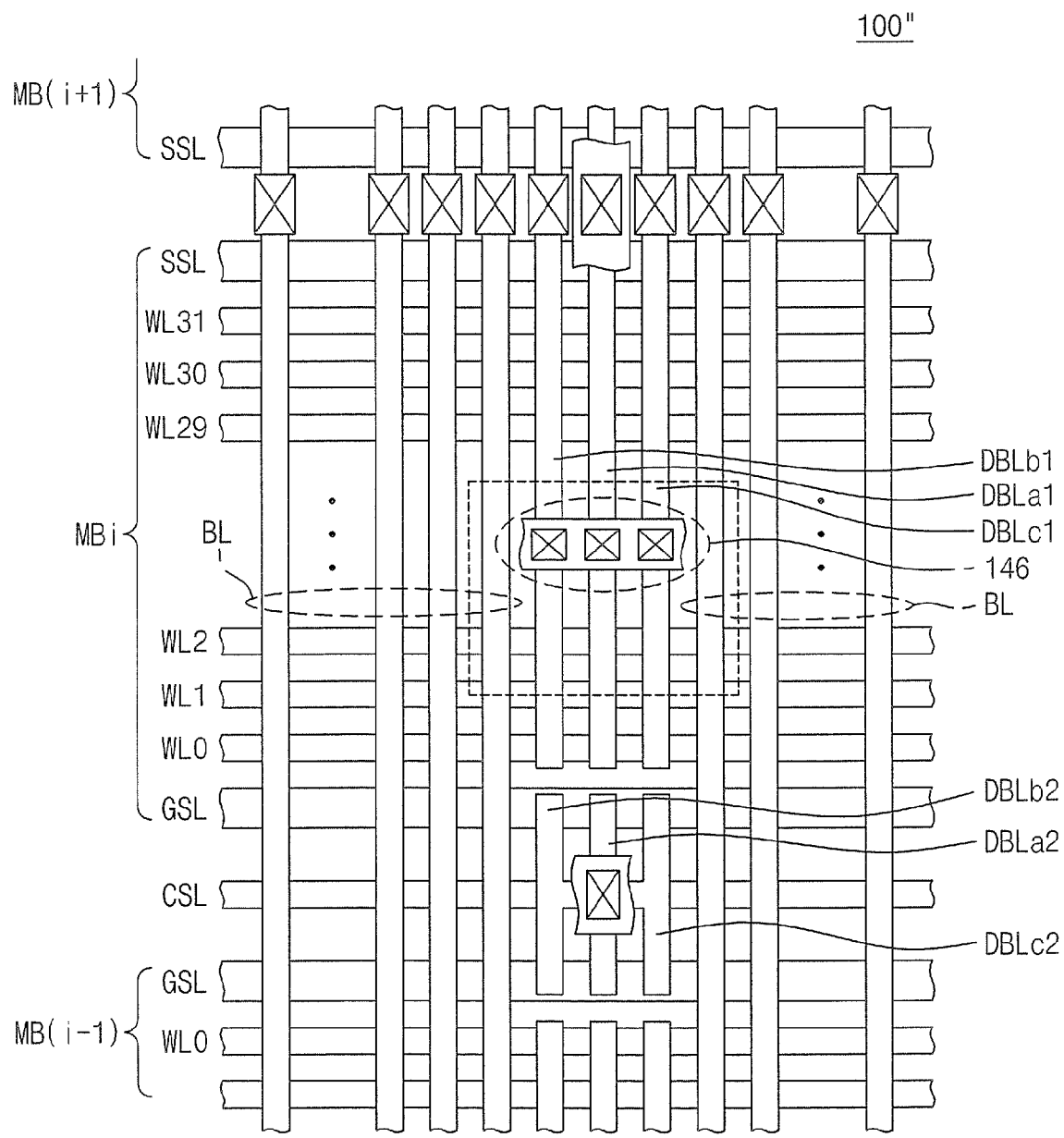

FIGS. 4A-4B illustrate an integrated circuit memory device 100" according to a further embodiment of the present invention. This memory device 100" includes a primary dummy bit line segment DBLa1, as further illustrated by FIG. 3C, along with auxiliary dummy bit line segments DBLb0 and DBLc1, which are electrically connected together and biased at the same potential as the pocket P-well region 14 and P+ region 114. These bit line segments DBLa1, DBLb1 and DBLc1 may be patterned as joined segments as illustrated by region 145 in FIG. 4A or may be joined together at an upper level of metallization using the metal interconnects shown by region 146 in FIG. 4B. Similarly, the bit line segment DBLa2, which is connected to the common source line CSL, may be joined with immediately adjacent bit line segments DBLb2 and DBLc2, as illustrated. Based on these electrical connections, the bit line segments DBLa1, DBLb1 and DBLc1 will be driven with the same erase voltage (e.g., +20 Volts), which is transferred to the pocket P-well region 14, during an operation to erase the memory device 100". Moreover, during this erase operation, the bit lines associated with the normal strings of CTF memory cells may be electrically floated.

Accordingly, these embodiments of the invention include a flash memory array having at least a first page of charge trap memory cells therein electrically coupled to a first word line within a first row of the array. This first page of charge trap memory cells includes a plurality of addressable "normal" memory cells, which are configured to store data to be retrieved during read operations, and a plurality of immediately adjacent non-addressable "dummy" memory cells, which are configured to store dummy data that is not retrievable during the read operations. The plurality of immediately adjacent non-addressable memory cells include a primary dummy memory cell that is precluded from being programmed during operations to write a page of data into the first page of charge trap memory cells and is therefore susceptible to becoming "over-erased" and at least one auxiliary dummy memory cell. This auxiliary dummy memory cell(s) is programmed with dummy data during the operations to write a page of data into the first page of charge trap memory cells.

Figure 5A:
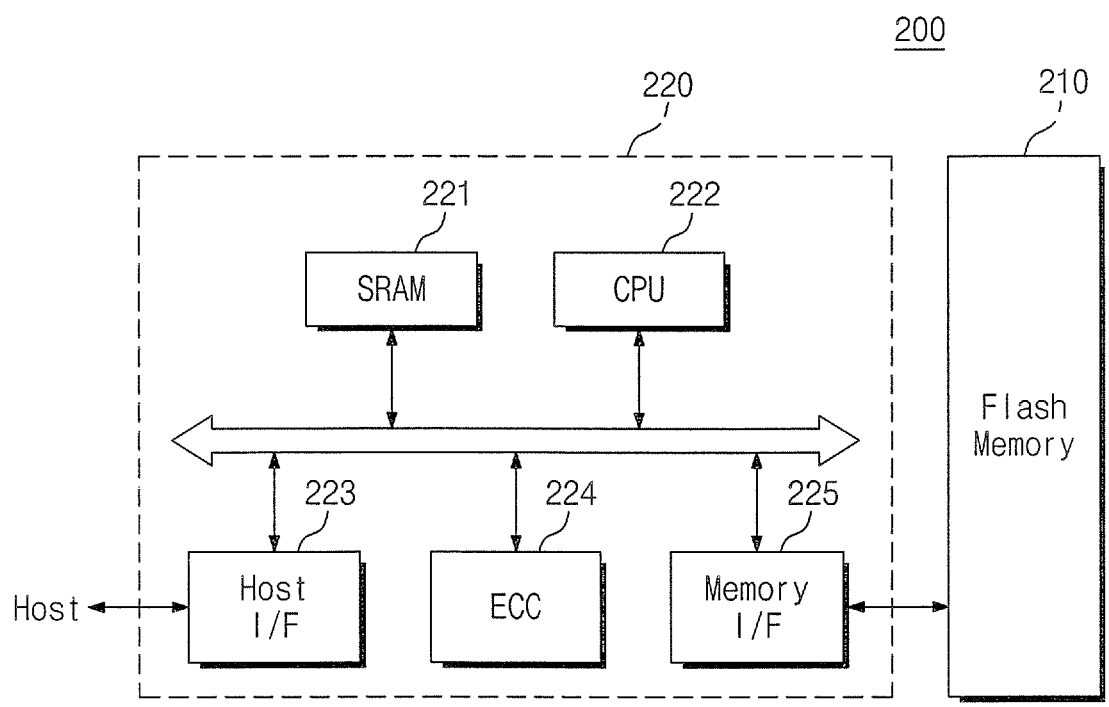
FIG. 5A is a block diagram of a memory card according to an embodiment of the present invention.
Figure 5B:
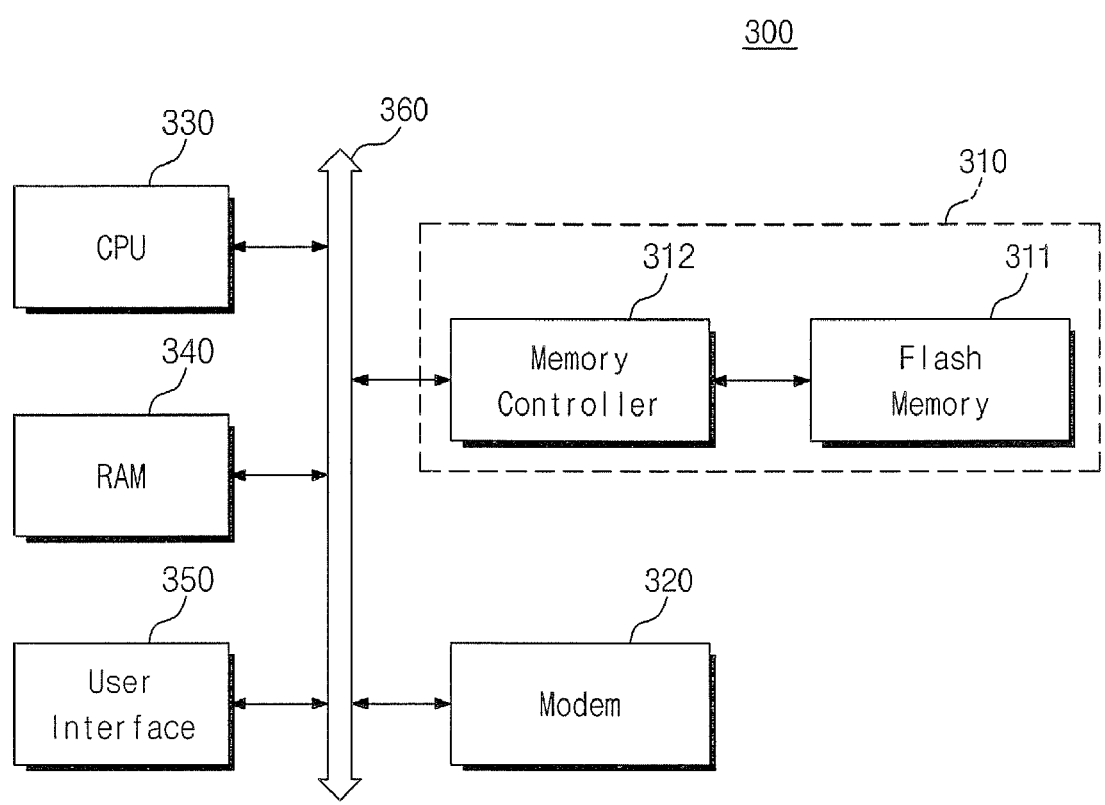
FIG. 5B is a block diagram of a memory system according to an embodiment of the present invention.

FIG. 5A illustrates an integrated circuit memory card 200 according to another embodiment of the present invention. This memory card 200 includes a memory controller 220 and a flash memory device 210, which may be configured to contain the elements of the memory devices 100-100" of FIGS. 2A-2D, 3A-3C and 4A-4B. This flash memory device 210 is electrically coupled to a bidirectional bus, via a memory interface circuit 225, which may be of conventional design. Additional memory, such as an SRAM memory device 221, a processing unit (CPU) 222 and an error checking and correction circuit (ECC) 224 may also be electrically coupled to the bidirectional bus. Moreover, communications between the flash memory and a host processor (not shown) may be achieved using a host processor interface circuit 223. FIG. 5B illustrates an integrated circuit memory system 300 that includes a memory sub-system 310. The memory sub-system 310 includes a flash memory device 311 and a memory controller 312, which electrically couples the flash memory device 310 to a bidirectional bus 360. This memory system 300 is further illustrated as including a central processing unit 330, a random access memory 340, a user interface 350 and a modem 320, which are electrically coupled to the bus 360.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
a semiconductor substrate having a well region of first conductivity type therein; and
a non-volatile memory array in the well region, said non-volatile memory array having first and second pluralities of NAND strings of charge trap memory cells therein that are separated from each other by a primary dummy NAND string of charge trap memory cells that is configured to block storage of program data therein and an auxiliary dummy NAND string of charge trap memory cells extending immediately adjacent the primary dummy NAND string, said primary dummy NAND string comprising a primary dummy bit line electrically connected to the well region and said auxiliary dummy NAND string configured to receive program data therein during operations to write data into the auxiliary dummy NAND string.

2. The memory device of claim 1, wherein said primary dummy NAND string further comprises a string selection transistor having a first source/drain region of first conductivity type therein that forms a non-rectifying junction with the well region; and wherein said primary dummy bit line is electrically connected to the first source/drain region of the string selection transistor.

3. The memory device of claim 2, wherein the string selection transistor has a second source/drain region of second conductivity type therein that forms a rectifying junction with the well region.

4. The memory device of claim 1, wherein said auxiliary dummy NAND string comprises an auxiliary dummy bit line electrically connected to the primary dummy bit line.

5. The memory device of claim 4, wherein said auxiliary dummy NAND string further comprises a string selection transistor having a first source/drain region of second conductivity type therein that forms a rectifying junction with the well region and is electrically connected to the auxiliary dummy bit line.

6. An integrated circuit memory device, comprising:
a non-volatile memory array having first and second auxiliary dummy NAND strings of charge trap memory cells therein that are configured to receive program data therein during operations to write data into the first and second auxiliary dummy NAND strings and are spaced apart from each other by a primary dummy NAND string of charge trap memory cells, said primary dummy NAND string configured to block storage of program data therein and comprising a primary dummy bit line electrically connected to first and second auxiliary dummy bit lines associated with the first and second auxiliary dummy NAND strings.

7. The memory device of claim 6, wherein said primary dummy NAND string comprises an NMOS string selection transistor having a P-type source/drain region electrically connected to the primary dummy bit line.

8. The memory device of claim 6, wherein said non-volatile memory array extends within a P-type well region; and wherein the P-type source/drain region of the NMOS string selection transistor forms a non-rectifying semiconductor junction with the P-type well region.

9. An integrated circuit memory device, comprising:
a well region of first conductivity type; and
a non-volatile memory array in said well region, said non-volatile memory array comprising a plurality of immediately adjacent dummy NAND strings of charge trap memory cells having respective dummy bit lines electrically connected to each other and to said well region, said plurality of immediately adjacent dummy NAND strings of charge trap memory cells comprising at least one dummy NAND string of charge trap memory cells configured to block storage of program data therein and at least another dummy NAND string of charge trap memory cells configured to receive program data therein.

10. The memory device of claim 9, wherein a string selection transistor associated with a first one of the plurality of immediately adjacent dummy NAND strings comprises a first source/drain region of first conductivity type and a second source/drain region of second conductivity type.

11. The memory device of claim 9, wherein the first source/drain region of first conductivity type forms a non-rectifying junction with said well region and is electrically connected to the dummy bit lines associated with the plurality of dummy NAND strings.

12. The memory device of claim 10, further comprising:
a common source line extending across said well region; and
a multi-level metal interconnect that extends on said common source line and between two of the dummy bit lines.

13. An integrated circuit memory device, comprising:
a semiconductor substrate having a well region of first conductivity type therein; and
a non-volatile memory array in the well region, said non-volatile memory array comprising a primary dummy NAND string of charge trap memory cells configured to block storage of program data therein and at least one auxiliary dummy NAND string of charge trap memory cells that extends immediately adjacent the primary dummy NAND string and is configured to receive program data therein, said primary dummy NAND string comprising a primary dummy bit line electrically connected to the well region.

14. The memory device of claim 13, wherein said nonvolatile memory array further comprises a first plurality of NAND strings of charge trap memory cells that are separated from the primary dummy NAND string by the auxiliary dummy NAND string.

15. The memory device of claim 14, wherein said nonvolatile memory array further comprises a second plurality of NAND strings of charge trap memory cells; and wherein the primary dummy NAND string extends between the first and second pluralities of NAND strings.

16. The memory device of claim 13, further comprising:
a common source line extending across said well region; and
a multi-level metal interconnect that extends on said common source line, at a location adjacent the at least one auxiliary dummy NAND string.

17. A charge trap flash memory device, comprising:
a flash memory array having at least a first page of charge trap memory cells therein electrically coupled to a first word line, said first page of charge trap memory cells comprising a plurality of memory cells configured to store data to be retrieved during read operations and a plurality of immediately adjacent memory cells configured to store dummy data that is not retrievable during the read operations;
wherein the plurality of immediately adjacent memory cells comprise:
a primary dummy memory cell that is precluded from being programmed during operations to write a page of data into the first page of charge trap memory cells; and
at least one auxiliary dummy memory cell that is programmed with dummy data during the operations to write a page of data into the first page of charge trap memory cells.

18. The memory device of claim 17, wherein said at least one auxiliary dummy memory cell comprises a pair of auxiliary dummy memory cells located on opposite sides of the primary dummy memory cell.

19. An integrated circuit memory device, comprising:
a nonvolatile memory array having a plurality of NAND-type strings therein, said plurality of NAND-type strings comprising:
at least one auxiliary dummy NAND-type string having nonvolatile memory cells therein that undergo programming but not reading during respective operations to program and read said nonvolatile memory array; and
at least one primary dummy NAND-type string extending adjacent the at least one auxiliary dummy NAND-type string, said at least one primary dummy NAND-type string having nonvolatile memory cells therein that are precluded from being programmed during the operations to program said nonvolatile memory array.

* * * * *